United States Patent
Williams et al.

(10) Patent No.: US 6,204,533 B1
(45) Date of Patent: Mar. 20, 2001

(54) VERTICAL TRENCH-GATED POWER MOSFET HAVING STRIPE GEOMETRY AND HIGH CELL DENSITY

(75) Inventors: Richard K. Williams, Cupertino; Wayne B. Grabowski, Los Altos, both of CA (US)

(73) Assignee: Siliconix Incorporated, Santa Clara, CA (US)

( * ) Notice: Subject to any disclaimer, the term of this patent is extended or adjusted under 35 U.S.C. 154(b) by 0 days.

(21) Appl. No.: 09/089,250

(22) Filed: Jun. 2, 1998

Related U.S. Application Data

(63) Continuation-in-part of application No. 08/919,523, filed on Aug. 28, 1997, now Pat. No. 5,998,837, which is a continuation-in-part of application No. 08/846,688, filed on Apr. 30, 1997, now Pat. No. 5,998,836, which is a continuation of application No. 08/459,555, filed on Jun. 2, 1995, now abandoned.

(51) Int. Cl.[7] ............................................... H01L 29/76
(52) U.S. Cl. ................................. 257/341; 257/331
(58) Field of Search .................... 257/341, 342, 257/331

(56) References Cited

U.S. PATENT DOCUMENTS

| | | | |
|---|---|---|---|
| 5,877,538 | * 3/1999 | Williams | 257/401 |
| 5,998,836 | * 12/1999 | Williams | 257/341 |
| 5,998,837 | * 12/1999 | Williams | 257/341 |

* cited by examiner

*Primary Examiner*—Mark V. Prenty
(74) *Attorney, Agent, or Firm*—Skjerven Morrill MacPherson; David E. Steuber

(57) ABSTRACT

A vertical trench-gated power MOSFET includes MOSFET cells in the shape of longitudinal stripes. The body diffusion of each cell contains a relatively heavily-doped region which extends parallel to the length of the cell and contacts an overlying metal source/body contact layer at specific locations. In one embodiment, the contact is made at an end of the cell. In another embodiment, the contact is made at intervals along the length of the cell. In addition, the power MOSFET contains diode cells placed at intervals in the array of cells. The diode cells contain diodes connected in parallel with the MOSFET cells and protect the gate oxide layer lining the trenches from damage due to large electric fields and hot carrier injection. By restricting the areas where the body contact is made and using the diode cells, the width of the MOSFET cells can be reduced substantially, thereby reducing the on-resistance of the power MOSFET.

8 Claims, 17 Drawing Sheets

VERTICAL TRENCH-GATED POWER MOSFET HAVING STRIPE GEOMETRY AND HIGH CELL DENSITY

This is a continuation-in-part of application Ser. No. 08/919,523, filed Aug. 28, 1997, now U.S. Pat. No. 5,998,837, which is a continuation-in-part of application Ser. No. 08/846,688, filed Apr. 30, 1997, now U.S. Pat. No. 5,998,836, which is a continuation of application Ser. No. 08/459,555, filed Jun. 2, 1995, now abandoned.

BACKGROUND OF THE INVENTION

A power MOSFET is typically formed in a geometric pattern of cells. The cells may be in the shape of a closed figure such as a square or hexagon or they may comprise a series of parallel longitudinal stripes. The cell is defined at its perimeter by the gate electrode, and the interior of each cell normally contains a source diffusion and a body diffusion. In vertical power MOSFETs a single drain is normally located on the opposite side of the chip from the source and body and thus underlies the cells.

FIGS. 1A, 1B and 1C illustrate overhead views of a single cell of a trench-gated MOSFET in a square, hexagonal and stripe configuration, respectively. In each figure, the outermost region represents one-half of the trenched gate (the other half belonging to the adjacent cell), the middle region represents the source region, and the innermost region represents the body contact region. The body region is in effect a continuation of the body contact region and extends under the source region to the sidewall of the trench, where the channel is located. The hatched regions represent the overlying metal source contact which in many power MOSFETs also contacts the body region to prevent the parasitic bipolar transistor from turning on.

The dimensions of each cell are defined by Ysb, which is the width of the source and body regions, i.e., the mesa inside the gate trench, and Yg, which is the width of the gate. As indicated, one-half of Yg is located on each side of the source/body region. The overall width or pitch of the cell is equal to Ysb+Yg.

The resistance of the MOSFET when it is turned on is directly related to the width of the channel, which lies along the wall of the trench. A figure of merit for a power MOSFET is the area/perimeter ratio or A/W, which is the amount of area that is required to provide a given channel width. Generally speaking, the lower the area/perimeter ratio, the lower the on-resistance of the MOSFET.

Using simple geometric formulas, the area and channel width (measured horizontally along the wall of the trench), and the resulting value of A/W, can be calculated for each of cells shown in FIGS. 1A, 1B and 1C.

For the square cell shown in FIG. 1A:

$$A=(Ysb+Yg)^2$$

$$W=4 \cdot Ysb$$

and therefore $$\frac{A}{W} = \frac{(Ysb+Yg)^2}{4 \cdot Ysb}$$

For the hexagonal cell shown in FIG. 1B:

$$A = \frac{\sqrt{3}}{2}(Ysb+Yg)^2$$

$$W = 2\sqrt{3} \cdot Ysb$$

and $$\frac{A}{W} = \frac{(Ysb+Yg)^2}{4 \cdot Ysb}$$

Finally, for the striped cell shown in FIG. 1C:

$$A=(Ysb+Yg) \cdot Z$$

$$W=2 \cdot Z$$

and $$\frac{A}{W} = \frac{(Ysb+Yg)}{2}$$

or one-half of its cell pitch. Z, which is the length of the striped cell, drops out of the formula for A/W.

It is apparent from each of these equations that area/perimeter ratio A/W decreases with reductions in the cell pitch (Ysb+Yg). FIG. 2 is a graph showing A/W as a function of cell density for three types of cells. Curve A represents A/W for a striped cell, curve B represents A/W for a square cell having a gate length Yg of 1 micron, and curve C represent A/W for a square cell having a gate length of 0.65 micron. Note that the cell density, which is measured in millions of cells per square inch, is intended to be a measure of the cell dimension that must be defined by photolithographic processes. Thus the density of the striped cells, in order to be equivalent to the density of the square cells, is figured on the basis of the number of square cells having a side dimension equal to the width of the stripe that would occupy a square inch. The corresponding cell pitch is shown at the top of the graph, a pitch of about 4.5 microns corresponding, for example, to a cell density of 32 Mcells/in$^2$.

The current practical limit of cell density is in the neighborhood of 32 to 40 million cells/in$^2$, corresponding to a cell pitch of about 4.5 microns and, for the square cell where Yg=1 micron, an A/W of about 1.44. In part, this limit arises because of the necessity of forming a body contact region within each cell to avoid parasitic bipolar turn-on, as shown in FIGS. 1A–1C. Another cause is the need to form a deep diffusion within each cell, as taught in U.S. Pat. No. 5,072,266 to Bulucea et al., to protect the gate oxide layer. In conduction, these factors place a lower limit on the lateral dimension of each cell and hence the cell density.

As indicated in FIG. 2, for cell densities less than 32–40 Mcells/in$^2$ the area/perimeter ratio of square cells is considerably lower than the area/perimeter ratio of striped cells. In fact, for striped cells a density of about 80 Mcells/in$^2$ is required to reach the A/W of 1.44 for square cells at a density of 32 Mcells/in$^2$.

SUMMARY

In accordance with this invention a trench-gated power MOSFET having a cell density as high as 178 Mcells/in$^2$ is fabricated, using a striped cell geometry. As indicated in FIG. 2, this requires that the cell pitch be about 1.9 microns. This reduced cell pitch is obtained by forming the body contact region in various locations along the "stripe". In one embodiment the body contact region is formed at the end of the stripe; in other embodiments the body contact region is formed at intervals along the stripe to limit resistive losses and consequent voltage drops from occurring between the source and body in portions of the striped cell.

Moreover, the gate oxide layer is protected by forming a deep diffusion at periodic intervals throughout the cell lattice, as taught in U.S. Patent application Ser. No. 08/459,555, filed Jun. 2, 1995, which is incorporated herein by reference in its entirety.

Using these techniques, the cell pitch can be reduced to about 1.9 microns, thereby reducing the area/perimeter ratio by a factor on the order of 36%.

BRIEF DESCRIPTION OF THE DRAWINGS

The broad principles of this invention will be better understood by reference to the following drawings, in which identical numerals are used to identify elements which physically or functionally the same.

Note that, to emphasize the elements of the invention, the above figures are not generally drawn to scale.

DESCRIPTION OF THE INVENTION

Figure 1C:
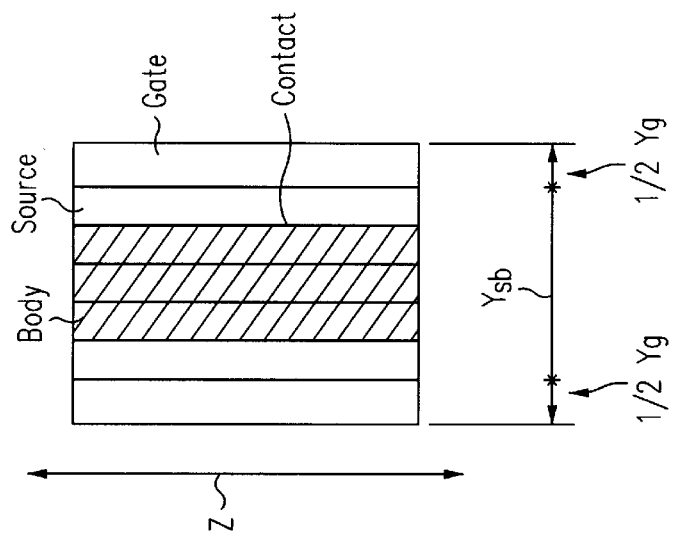
FIGS. 1A, 1B and 1C show top views of square, hexagonal and striped MOSFET cell geometries, respectively.
Figure 1B:
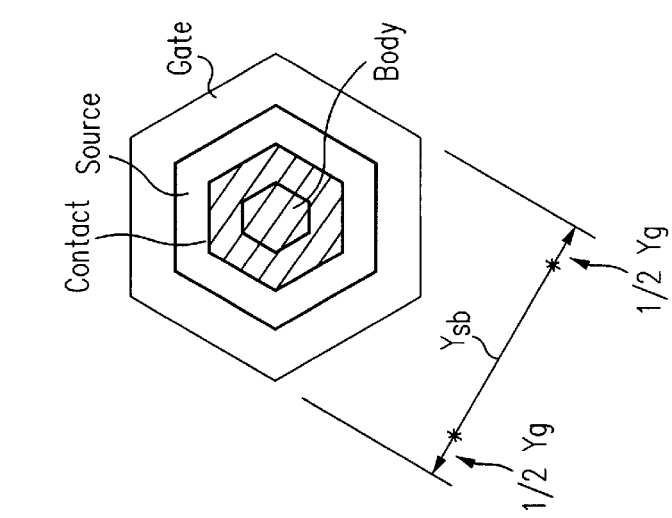
Figure 1A:
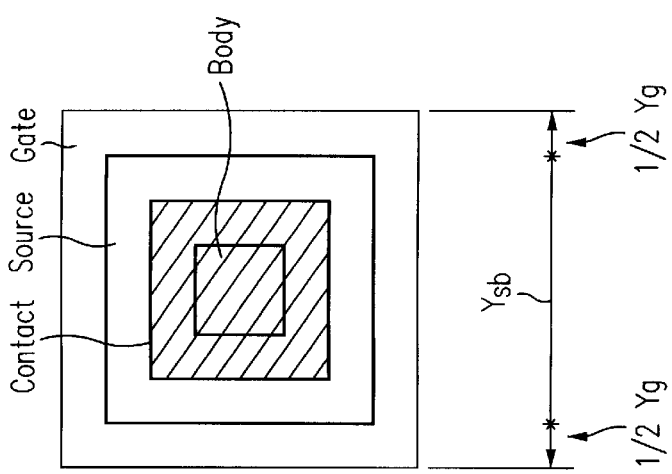
Figure 2:
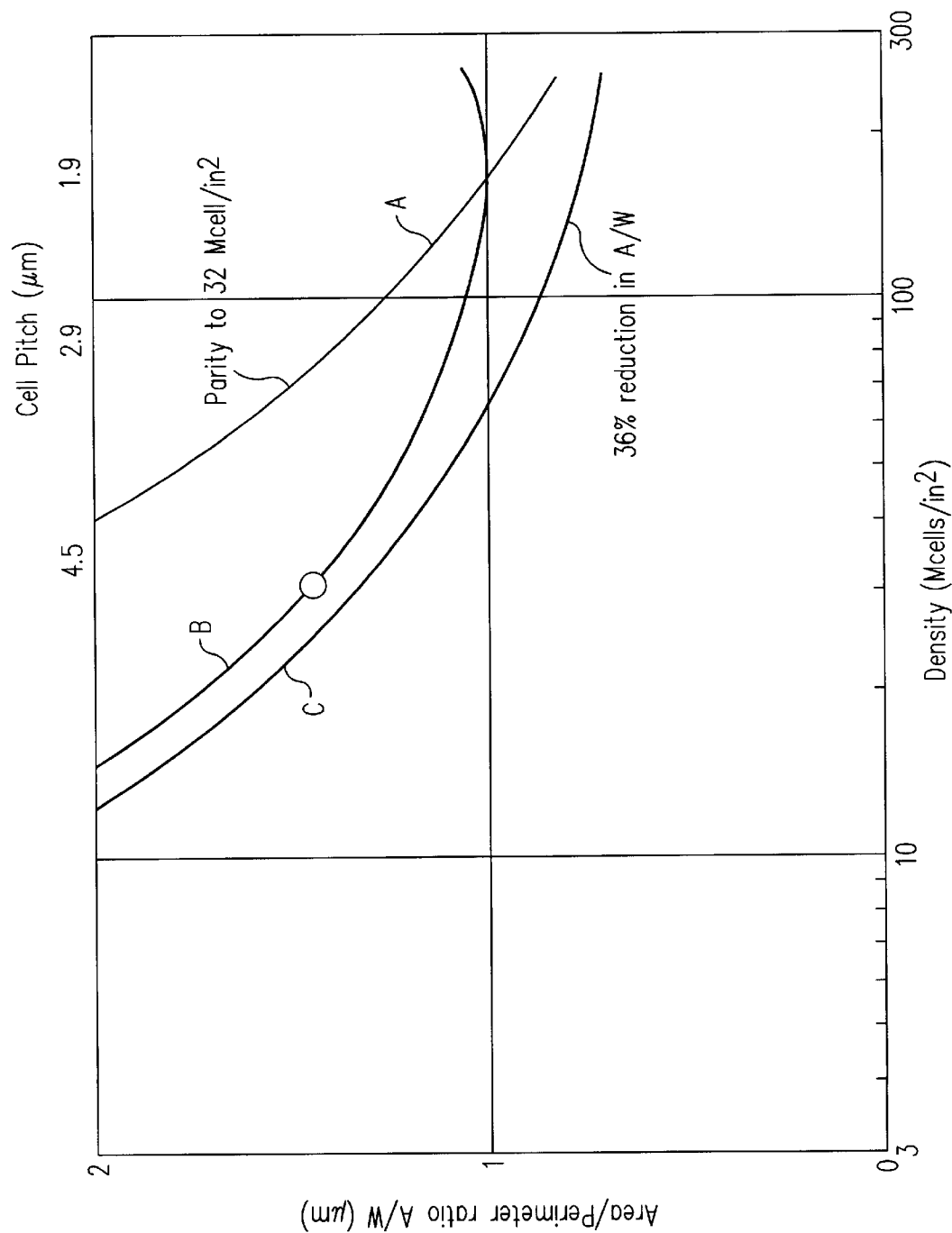
FIG. 2 is a graph showing the area/perimeter ratio A/W as a function of cell density in a power MOSFET.
Figure 3:
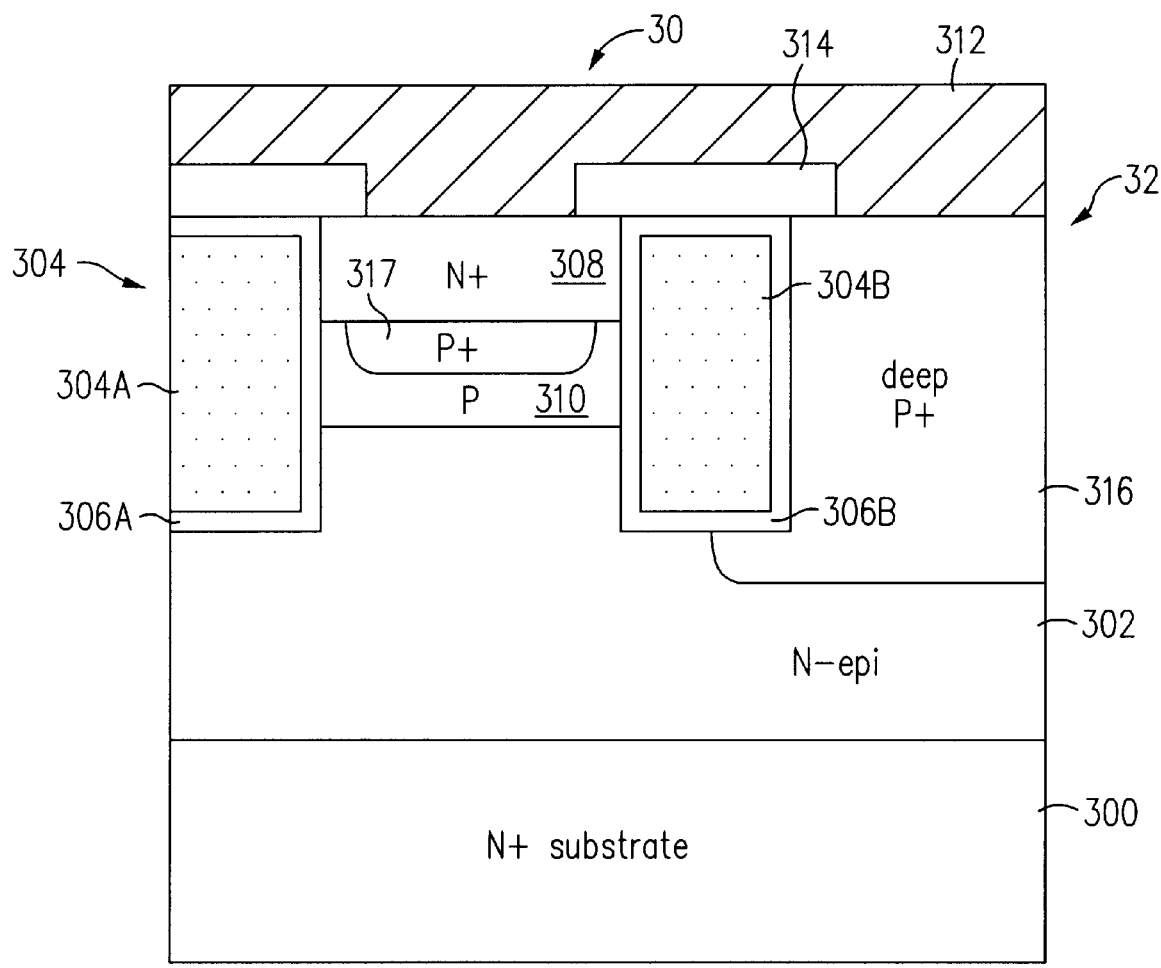
FIG. 3 is a cross-sectional view of a single striped MOSFET cell and a deep diffusion to protect the gate oxide layer.

A cross-sectional view of a MOSFET cell in accordance with this invention is shown in FIG. 3. MOSFET cell 30 is formed on an N-type epitaxial (epi) layer 302, which is grown on an N+ substrate 300. Cell 30 is stripe-shaped and is defined on two sides by opposing gate sections 304A and 304B which are positioned within trenches formed at the top surface of N-epi layer 302. Sections 304A and 304B are two sections of a gate 304 which contains a plurality of similar gate sections arranged in a parallel array to form a corresponding plurality of parallel striped cells. Gate sections 304A and 304B are electrically isolated from N-epi layer 302 by gate oxide layers 306A and 306B, respectively. Gate sections 304A and 304B are electrically tied together at some location on the MOSFET. For example, the polysilicon layer that is normally used to form gate 304 can be patterned in such a way that the parallel gate sections merge in some region.

Figure 17:
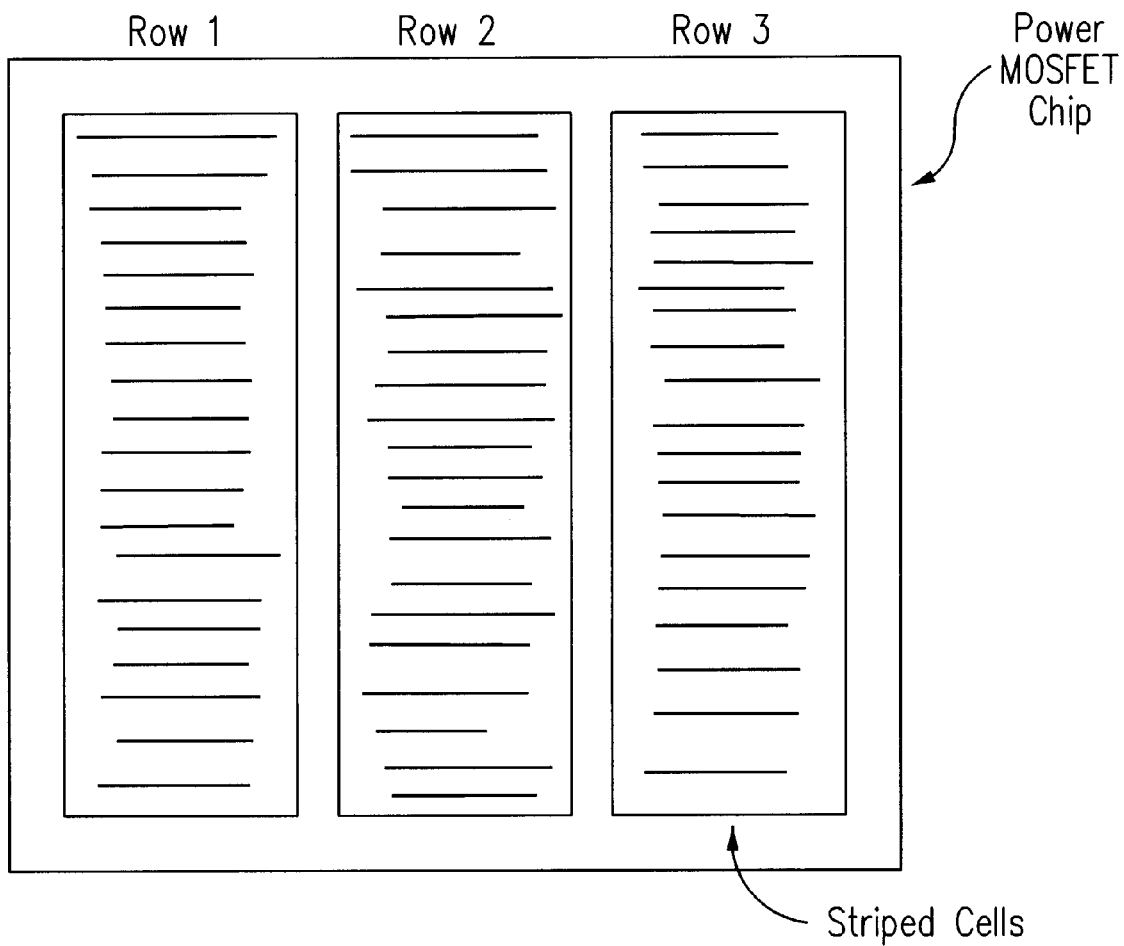
FIG. 17 shows a top view of a power MOSFET chip containing stripe MOSFET cells arranged into three rows.

Generally cell 30 has a length dimension parallel to gate sections 304A and 304B that is at least ten times its width dimension perpendicular to gate sections 304A and 304B. On the semiconductor chip in which cell 30 is formed, and which forms the power MOSFET, there are a relatively small number of rows of striped cells (e.g., less than ten), as compared with a chip containing closed cells (e.g., squares or hexagons) where there are typically thousands of cells in each dimension parallel to the surface of the chip. FIG. 17, for example, shows a top view of a power MOSFET chip which contains three rows of stripe MOSFET cells. Each row would typically contain thousands of cells.

Cell 30 contains an N+ source region 308 and a P-body 310. Electrical contact is made with N+ source region 308 by means of a metal layer 312 through an opening in an oxide layer 314. Oxide layer 314 generally overlies the gate sections 304A and 304B but extends some distance over N+ source region 308 to insure that metal layer 312 does not come into contact with gate sections 304A and 304B. Shorting the gate to the source would disable the MOSFET.

As is known, when the MOSFET is turned on current flows vertically between the metal layer 312 and a drain contact (not shown) that is formed at the bottom of the N+ substrate 300. The path of the current runs through the N+ source region 308, the P-body 310, the N-epi layer 302 and the N+ substrate 300. The current flows through a channel region located adjacent the trench in the P-body, and the flow of current through the channel region can be interrupted by biasing the gate 304 appropriately so as to turn the MOSFET off.

Also shown in FIG. 3 is a protective diode cell 32 containing a deep P+ diffusion 316 of the kind described in the above-referenced U.S. Patent application Ser. No. 08/459,555. Deep P+ diffusion 316 forms a PN junction with the N-type material in the N-epi layer 302. This PN junction functions as a diode. Metal layer 312 ties the deep P+ diffusion 316 (i.e., one terminal of the diode) to N+ source region 308 of MOSFET cell 30 such that the diode is connected in parallel with the channel of the MOSFET cell.

Deep P+ diffusion 316 operates to reduce the strength of the electric field across the gate oxide layers 306A, 306B and at the corners of the trenches and limits the formation of hot carriers in the vicinity of the trench. The diode also operates as a voltage clamp and thereby limits the voltage across the gate oxide layer. While the PN junction in diode cell 32 is shown as being below the bottom of the trench, this need not be the case so long as the diode breaks down before the MOSFET cell 30

In a preferred embodiment, one protective diode cell is provided for a selected number of MOSFET cells in a repetitive pattern across the MOSFET. The number of diode cells per MOSFET cells is determined by the design criteria of the MOSFET. In general, for example, MOSFETs which are expected to experience breakdown more often will require a greater proportion of diode cells.

Figure 7:
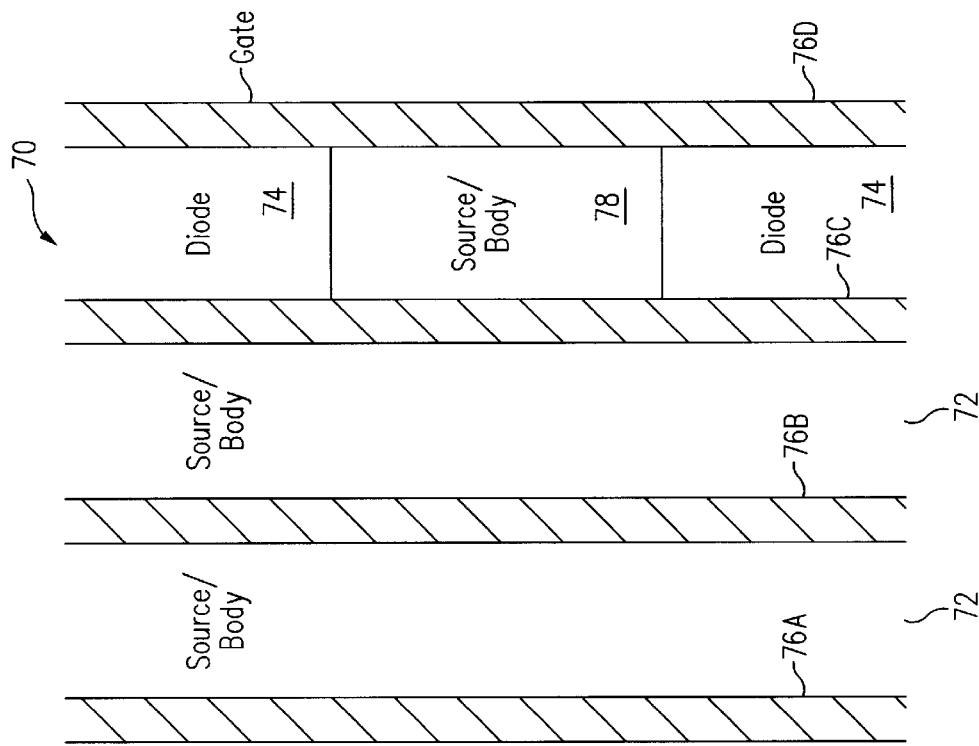
FIG. 7 is a top view of an embodiment in which the diode cell is broken periodically by MOSFET cells.
Figure 6:
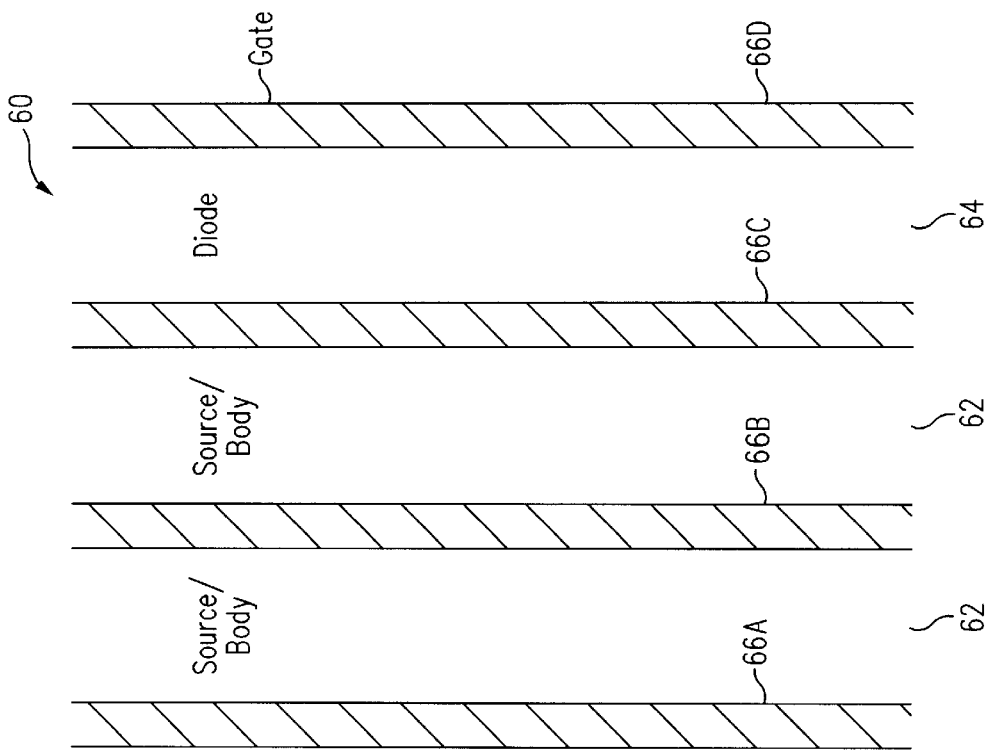
FIG. 6 is a top view of an embodiment in which the diode cell is uninterrupted.

FIGS. 6 and 7 show top views of MOSFETs 60 and 70, respectively, each of which contains two MOSFET cells 62, 72 for each diode cell 64, 74. The numerals 66A–66D and 76A–76D designate sections of the gates of MOSFETs 60 and 70. Diode cell 64 occupies the entire region between gate sections 66C and 66D whereas diode cell 74 is interrupted in a portion of the region between gate sections 76C and 76D to allow an additional MOSFET cell 78 to be formed.

Figure 4:
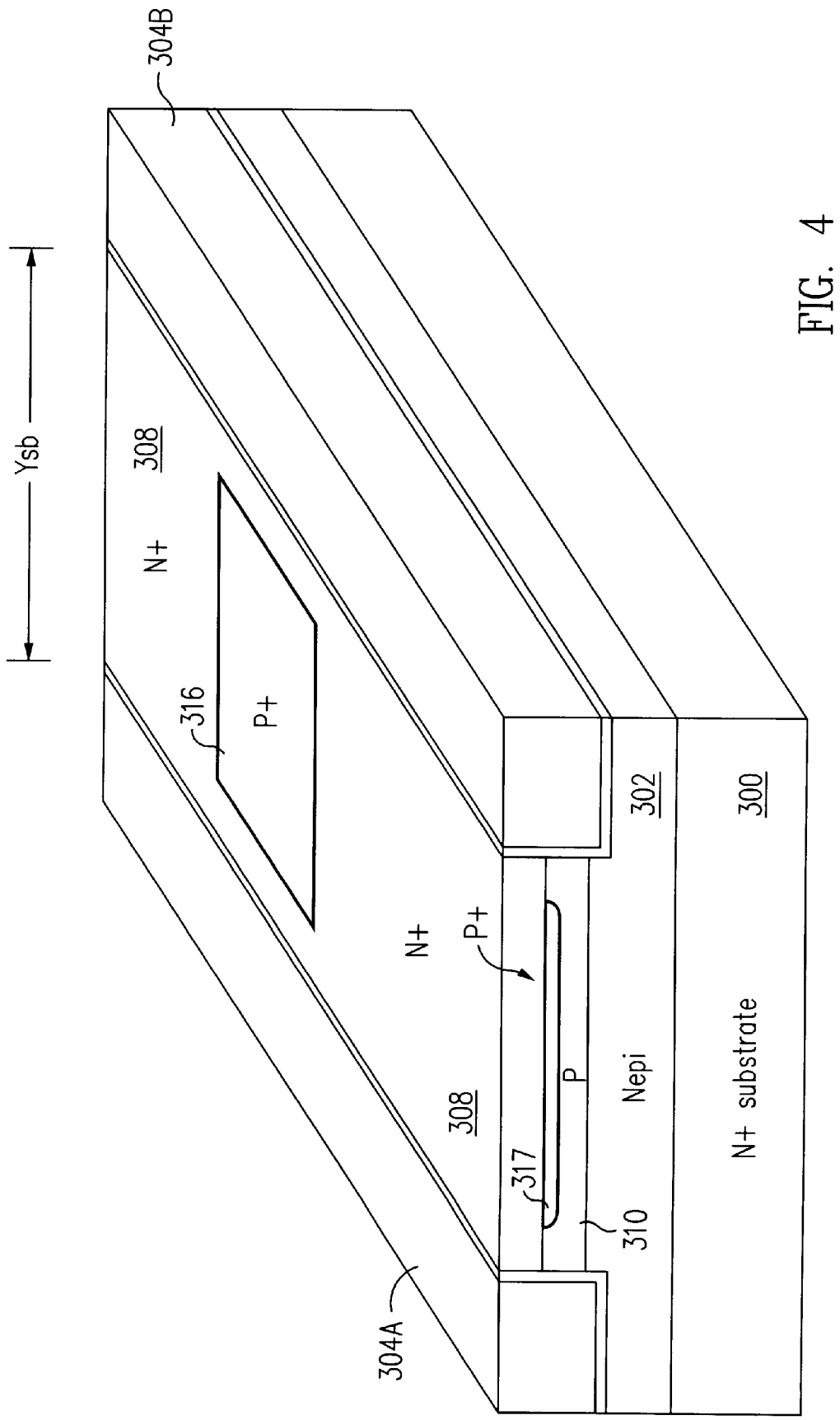
FIG. 4 is a perspective view of the MOSFET of FIG. 3.
Figure 10A:
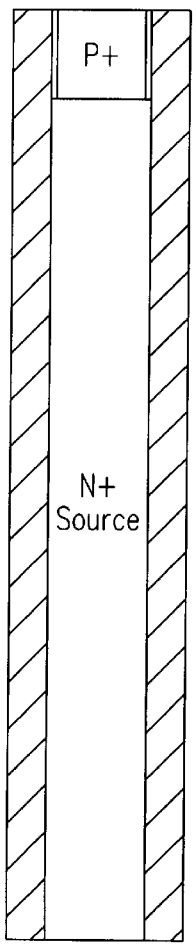
FIG. 10A is a top view of an embodiment in which the body contact region is brought to the surface at one end of the stripe cell.
Figure 10B:
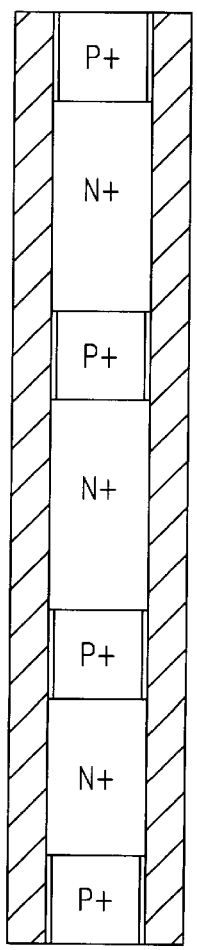
FIG. 10B is a top view of an embodiment in which the body contact region is brought to the surface at periodic intervals along the length of the stripe cell.

Returning to FIG. 3, MOSFET cell 30 also contains a P+ region 317 immediately below N+ source region 308. The dopant concentration of P+ region 317 is in the range of $5 \times 10^{18}$ to $8 \times 10^{19}$ cm$^{-3}$ (preferably about $3-4 \times 10^{19}$ cm$^{-3}$), as compared to a dopant concentration in the range of $8 \times 10^{15}$ to $7 \times 10^{17}$ cm$^{-3}$ for P-body 310 generally. Unlike conventional body contact regions, however, P+ region 317 does not reach the surface of epi layer 302 in the plane of FIG. 3. Instead the contact to P+ region 317 is made as shown in FIG. 4, which is a perspective view of MOSFET 30 without metal layer 312 and oxide layer 314 (as is apparent, FIGS. 3 and 4 are drawn to a different scale). P+ region 317 is brought to the surface of epi layer 302 in a location outside the plane of FIG. 3. This location may be at the end of the stripe cell, or as shown in FIG. 10B, there can be a series of P+ contact regions in a ladder arrangement along the stripe cell. When a metal layer is deposited over the structure, along with oxide layers over the trenches as shown in FIG. 3, the N+ source regions and P-body regions are shorted together. The arrangement shown in FIG. 10B reduces the voltage drop in the P-body region and thus is more effective in preventing parasitic bipolar turn-on. With this arrangement, since the body contact is formed only at specific locations rather than along the entire length of the cell, Ysb can be reduced to as low as 1.9 microns or even less, allowing a cell density of 178 Mcells/in$^2$ or more.

Figure 5:
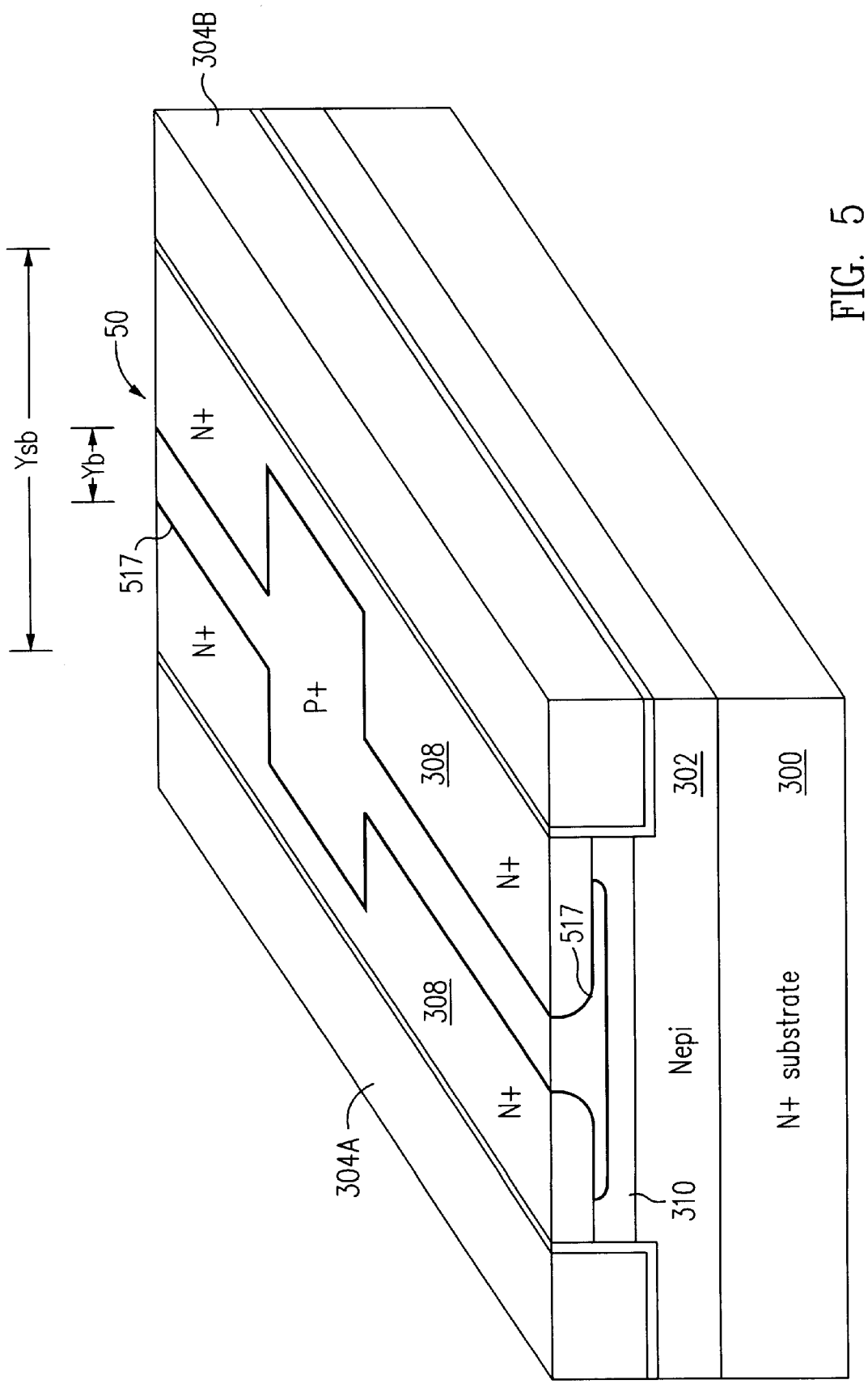
FIG. 5 is a perspective view of an alternative embodiment in which a thin central band at the surface of the semiconductor improves contact between the body region and an overlying metal contact layer.

The embodiment shown in FIG. 5 is even more effective in reducing the voltage drop in the P-body. MOSFET cell 50 is similar to MOSFET cell 30 in all respects, except that P+ region 317 is replaced by P+ region 517, which is additionally allowed to come to the surface of epi layer 302 along a thin band at the center of the cell. Since the width Yb of the band is much less than would normally be required to provide a good body contact, the presence of the thin surface band does not significantly affect the width Ysb of the mesa between gate sections 304A and 304B. As with the embodiment of FIG. 4, the areas where the P+ body contact region is brought to the surface across the entire mesa between gate section 304A and 304B can be located at the end of the cell or periodically at intervals along the length of the cell.

Figure 8:
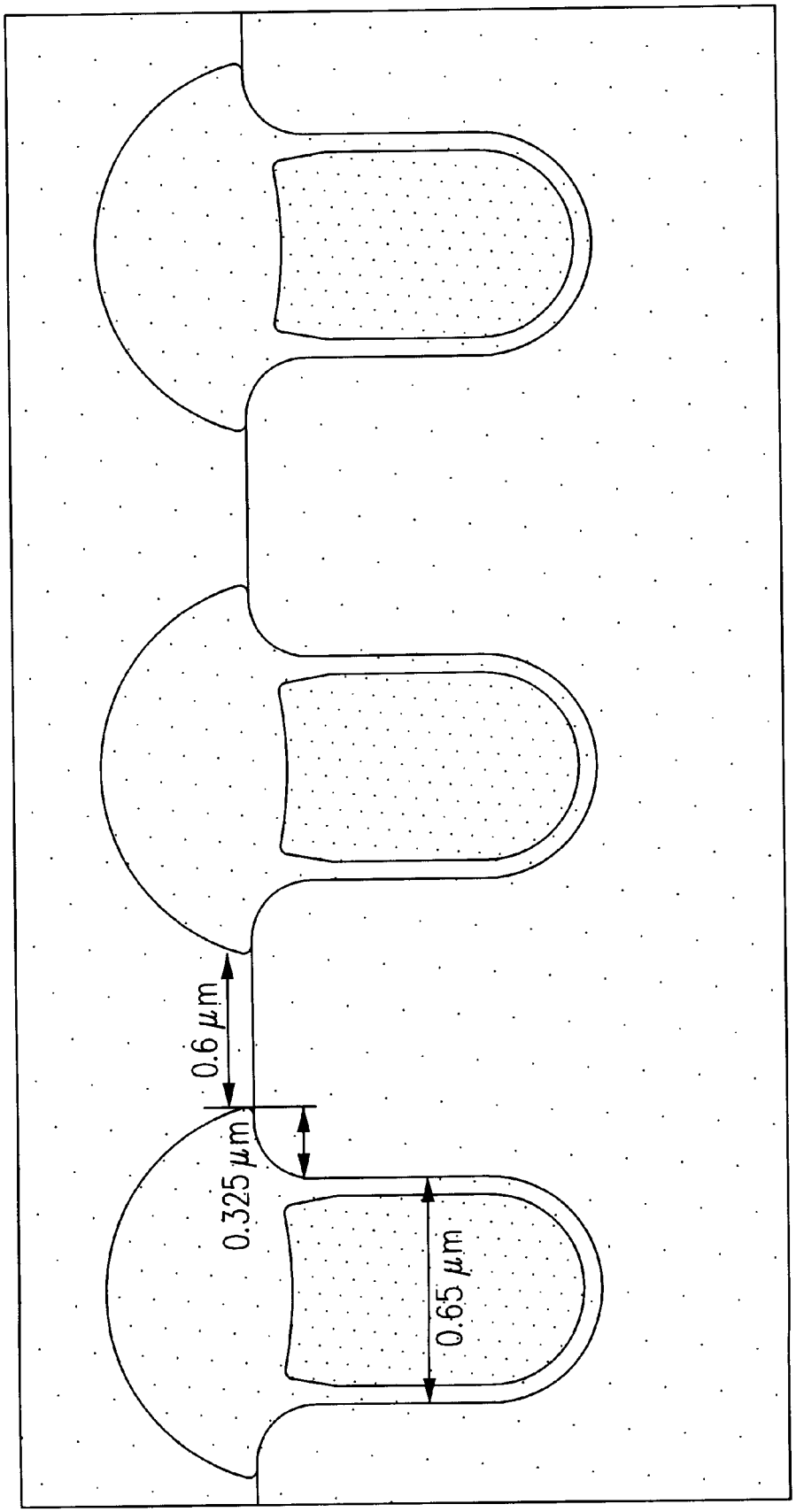
FIG. 8 is a cross-sectional photograph of a MOSFET according to the invention.

FIG. 8 is an actual photograph of a MOSFET cell in accordance with this invention having a pitch of 1.9 microns. The width of the trench (Yg) is 0.65 microns and the width of the mesa between trenches (Ysb) is 1.25 microns. The oxide layer overlying the gate trenches extends 0.325 microns over the mesa, leaving a width of 0.6 microns for the source/body contact.

Although there are numerous processes for fabricating a MOSFET in accordance with this invention, FIGS. 9A–9E illustrate an exemplary process for fabricating the MOSFETs shown in FIGS. 3–5.

Figure 9A:
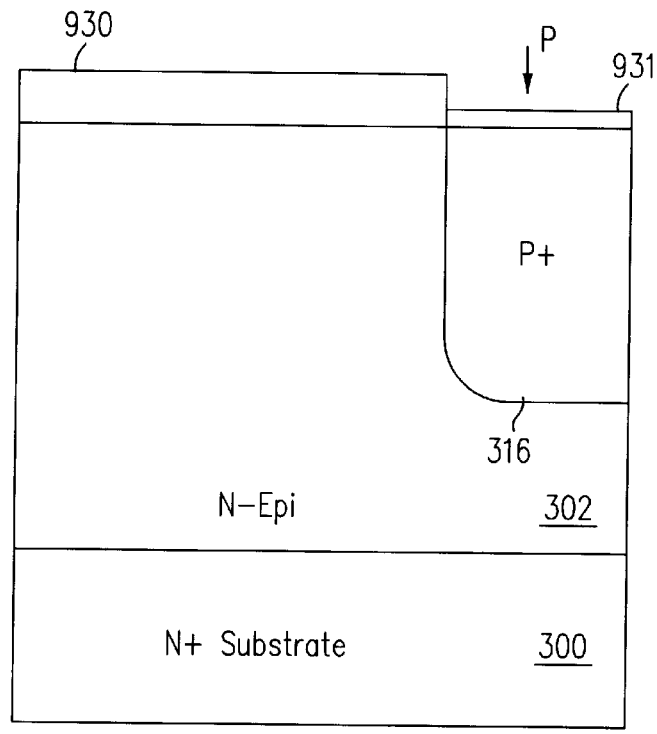
FIGS. 9A–9E illustrate a process of fabricating a MOSFET according to the invention.

Referring to FIG. 9A, the starting point is the N+ substrate 300 on which the N-epitaxial layer 302 is grown using known processes.

A thick oxide layer 930 is grown, masked and etched, and a thin oxide layer 931 is grown on the top surface of the structure where deep P+ diffusion 316 is to be formed. Deep P+ diffusion 316 is then implanted through thin oxide layer 931 at a dose of $1 \times 10^{14}$ to $7 \times 10^{15}$ cm$^{-2}$ and an energy of 60–100 keV, and then driven in to a depth of from 1 to 3 microns (typically 1.5 to 2 microns). The resulting structure is illustrated in FIG. 9A. Oxide layers 930 and 931 are then removed.

Figure 9B:
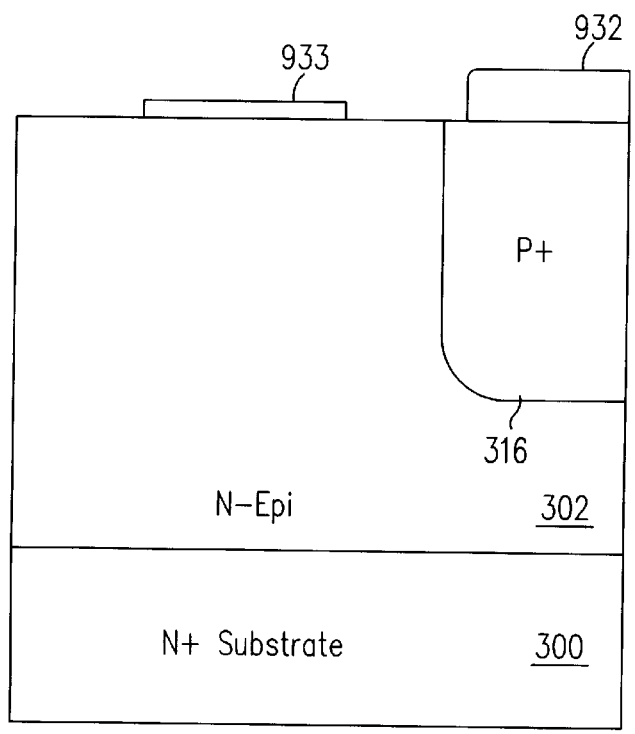

In one version of the process, a thick oxide layer 932 is grown and removed by photomasking except over deep P+ diffusion 316, and a thin oxide layer 933 is grown. Thin oxide layer 933 is masked and removed from the portions of the structure where the trenches are to be formed, as shown in FIG. 9B. The trenches are then masked and etched using known techniques of reactive ion or plasma dry etching. Then the trench is oxidized to form gate oxide layers 306A, 306B, and polysilicon is deposited into the trench until it overflows the top of the trench. The polysilicon is then doped with phosphorus by POCl$_3$ predeposition or ion implantation at a dose of $5 \times 10^{13}$ to $5 \times 10^{15}$ cm$^{-2}$ and an energy of 60 keV, giving it a sheet resistance of 20–70 Ω/square. For a P-channel device, the polysilicon is doped with boron using ion implantation to a sheet resistance of roughly 40–120 Ω/square. The polysilicon is then etched back until it is planar with the surface of the trench except where a mask protects it, so that it can subsequently be contacted with metal.

Figure 9C:
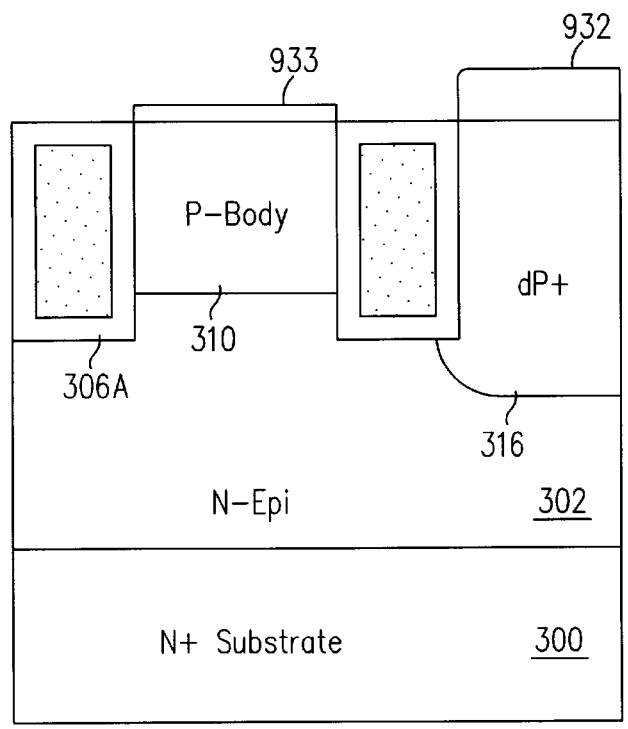

P-body 310 is then implanted through the thin oxide layer 933 (e.g., boron at a dose of $5 \times 10^{12}$ to $9 \times 10^{13}$ cm$^{-2}$ and an energy of 40–100 keV, typically 90 keV), and driven in at 1050° C. for 3–10 hours to a depth of 2–3 microns. A similar method is used in fabricating a P-channel device except that the dopant is phosphorus. The resulting structure is illustrated in FIG. 9C.

Figure 9D:
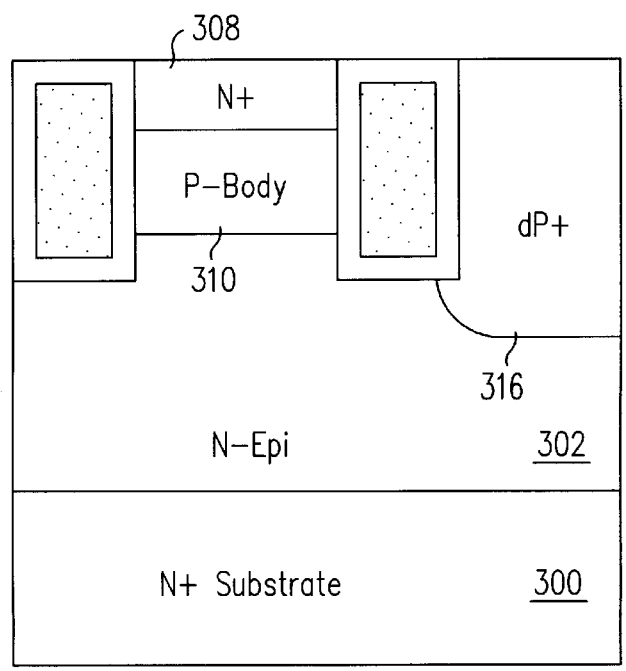

The N+ source region 34 is then introduced using a mask and an arsenic or phosphorus ion implantation (or a boron ion implantation for a P-channel device) at a dose of $1 \times 10^{15}$ to $1 \times 10^{16}$ cm$^{-2}$ at 20 to 100 keV. An anneal is then performed to correct for damage to the crystal. The resulting structure is shown in FIG. 9D.

Figure 10C:
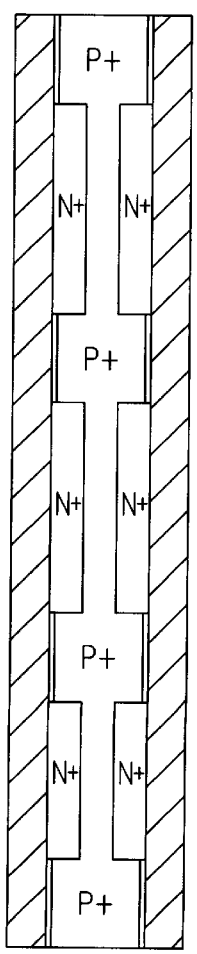
FIG. 10C is a top view of an embodiment in which the body contact region includes a thin band along the center of the stripe cell.

The mask that is used during the N+ source implant covers all areas other than the intended source regions. Thus, referring to FIGS. 4 and 5, the N+ source mask would cover the areas which are to be doped P+ at the surface to allow for contact to the P-body region. There could, for example, be a single P+ body contact region at either or both ends of the stripe cell, as shown in FIG. 10A; there could be P+ body contact regions spaced periodically along the stripe cell, as shown in FIGS. 4 and 10B; or there could be P+ body contact regions spaced periodically along the stripe cell with a central thin band of P+ along the length of the cell as shown in FIGS. 5 and 10C.

After the N+ source region 308 has been formed, the P+ region 317 is formed underneath the N+ source region 308.

Figure 9E:
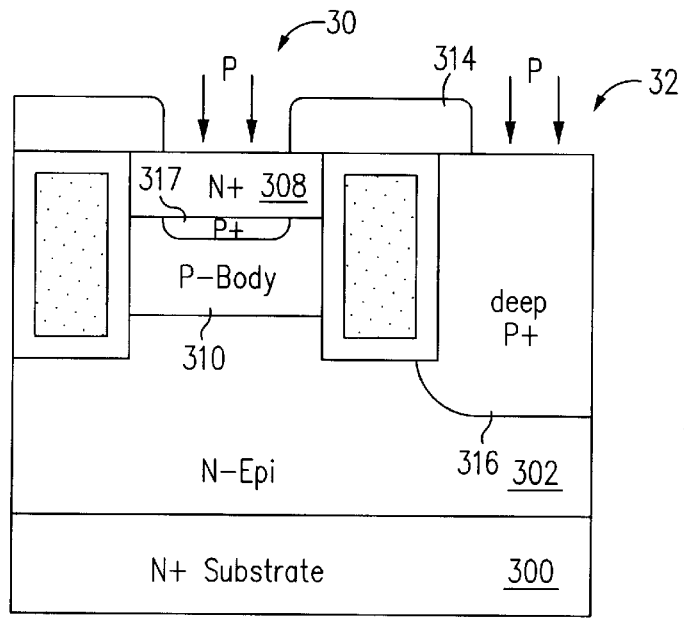

This can be done by implanting boron at a high energy (e.g., 200 keV to 2 MeV) along the entire stripe so that the dopant ends up concentrated beneath the N+ source region 308. The dose of this implant would typically be in the range of $1 \times 10^{14}$ to $5 \times 10^{15}$ cm$^{-2}$. Alternatively, this implant can be conducted before the N+ source region 308 is formed. To insure that the P+ dopant does not enter the channel region, where it would interfere with the threshold voltage, the P+ implant can conveniently be performed through the contact holes after the oxide layer 314 has been deposited over the trenches. Otherwise, a separate mask would be required for the P+ implant. This process is illustrated in FIG. 9E.

Alternatively, the P+ dopant can be implanted at a much lower energy (e.g., 20 to 60 keV) before the N+ source region 308 is formed, and the P+ dopant can be driven in until it reaches the desired depth below the yet-to-be-formed N+ source region 308.

The deep P+ diffusion does not need to be masked during the P+ implant, since the additional P+ dopant will not adversely affect the diode cell 32

Metal layer 312 is deposited, forming contacts with the source and body regions and the deep P+ region through the contact holes.

The die is then passivated with SiN or BPSG, and pad mask windows are etched to facilitate bonding.

Figure 11:
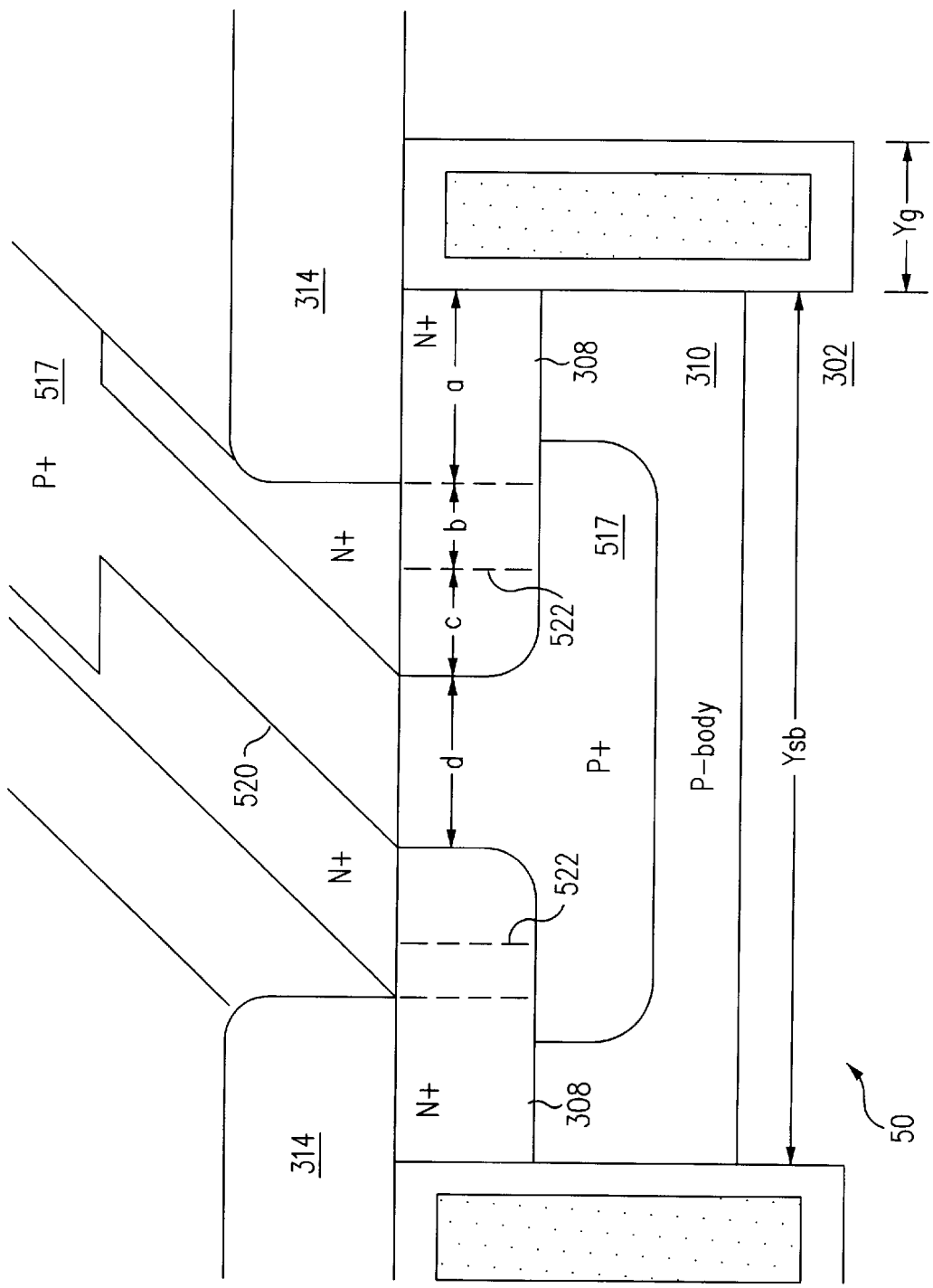
FIG. 11 is a detailed view of the MOSFET shown in FIGS. 5 and 10C.

FIG. 11 is a detailed view of MOSFET cell 50 shown in FIG. 5, illustrating how the P+ region 517 may be formed. The dashed lines 522 indicate where the edges of the mask used to form the N+ source region 308 were located. The letter "a" indicates the amount by which oxide layer 314 overlaps the mesa between the gate trenches. Thus, the edges of the N+ source mask were spaced a distance a+b from the trenches. The letter "c" indicates the lateral diffusion of the N+ source region 308 during drive-in. Assuming that Ysb is equal to 1.25 microns, the N+ source mask was spaced 0.325 microns from the trench, and oxide layer 314 overlapped the mesa by 0.225 microns. The lateral diffusion c was equal to 0.16 microns. Since MOSFET cell 50 is symmetrical about the centerline of the mesa, the following equation expresses the source/body width Ysb:

$$Ysb = 2a + 2b + 2c + d$$

$$1.25\mu = (2 \cdot 0.225\mu) + (2 \cdot 0.1\mu) + (2 \cdot 0.16\mu) + d$$

$$d = 0.2\mu$$

Thus with a total pitch (Ysb+Ya) of 1.9 microns, using the dimensions set forth above the width of the central P+ band 520 was 0.2 microns. The metal contact (not shown) would be 0.72 microns wide (2b+2c+d) and the contact with the N+ source region 308 would be 0.52 microns wide (2b+2c). The narrow width of the metal contact opening (0.72 microns) would require that the oxide layer 314 be kept thin enough to avoid the formation of voids when metal layer 314 is deposited.

The presence of both the central P+ band 520 and the overlying metal layer substantially reduces the amount of the voltage drop in the body in the embodiment of FIGS. 5, 10C and 11. However, a larger body voltage drop may be tolerated if the breakdown voltage of the diode cell 32 is significantly below the breakdown voltage of the MOSFET cell 30, since in that case the risk that parasitic bipolar transistor (N+ source region 308, P-body 310 and N-epi layer 302) will turn on is lessened. If so, the embodiments shown in FIGS. 3, 4, 10A and 10B may be satisfactory.

Another advantage of the MOSFET of this invention is that there is only a limited need for the channel blocks described in U.S. Pat. No. 5,468,982 to prevent current leakage. In closed cell arrangements the proportional area occupied by the channel blocks, which are located at the corners of the cells, increases as the dimensions of cell are reduced. With a striped cell arrangement, the effect of the channel blocks is negligible.

FIGS. 12–16 illustrate the advantages of a 178 Mcell/in$^2$ device.

Figure 12:
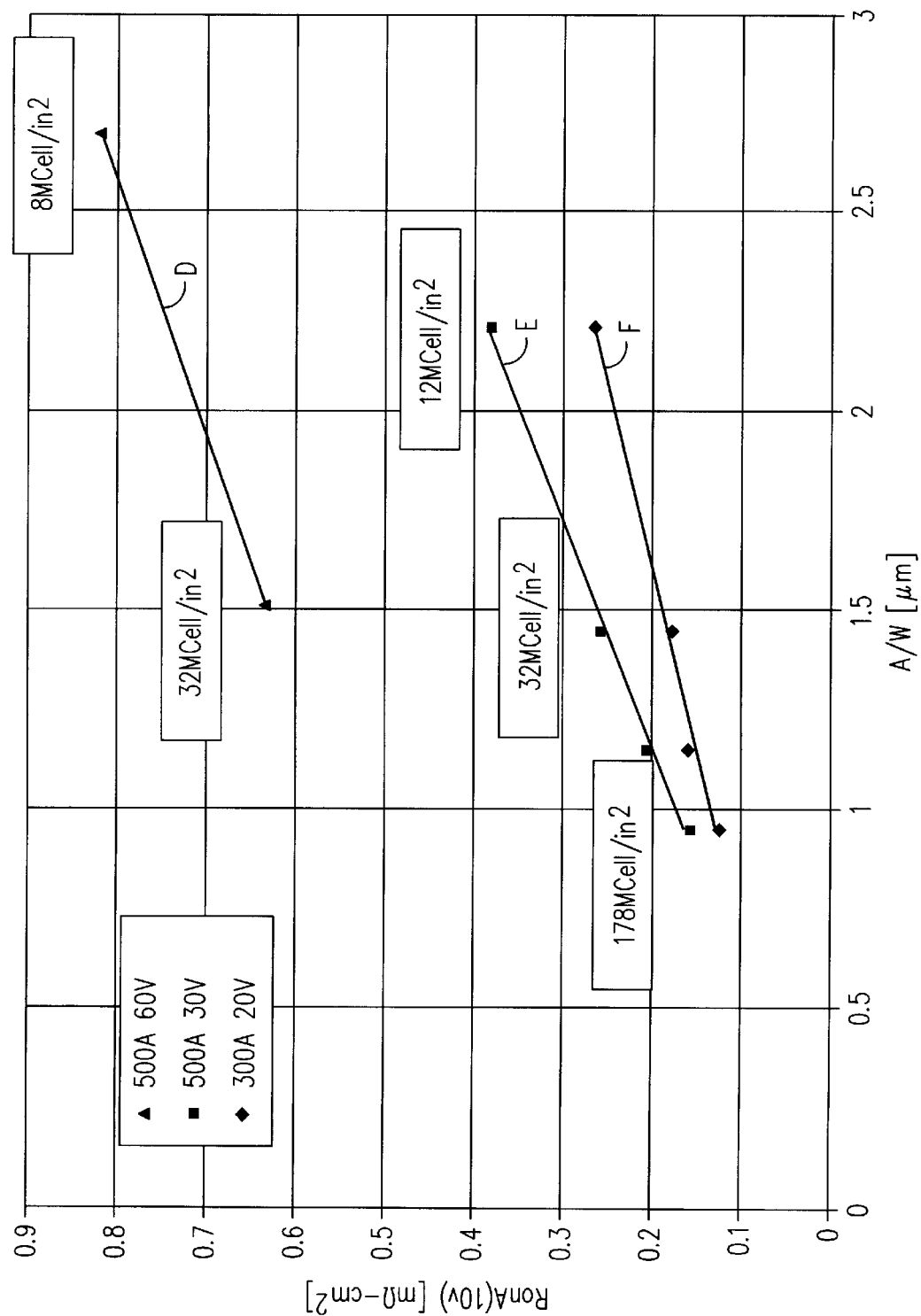
FIG. 12 is a graph showing specific on-resistance as a function of the area/perimeter ratio for MOSFETs having different cell densities.
Figure 13:
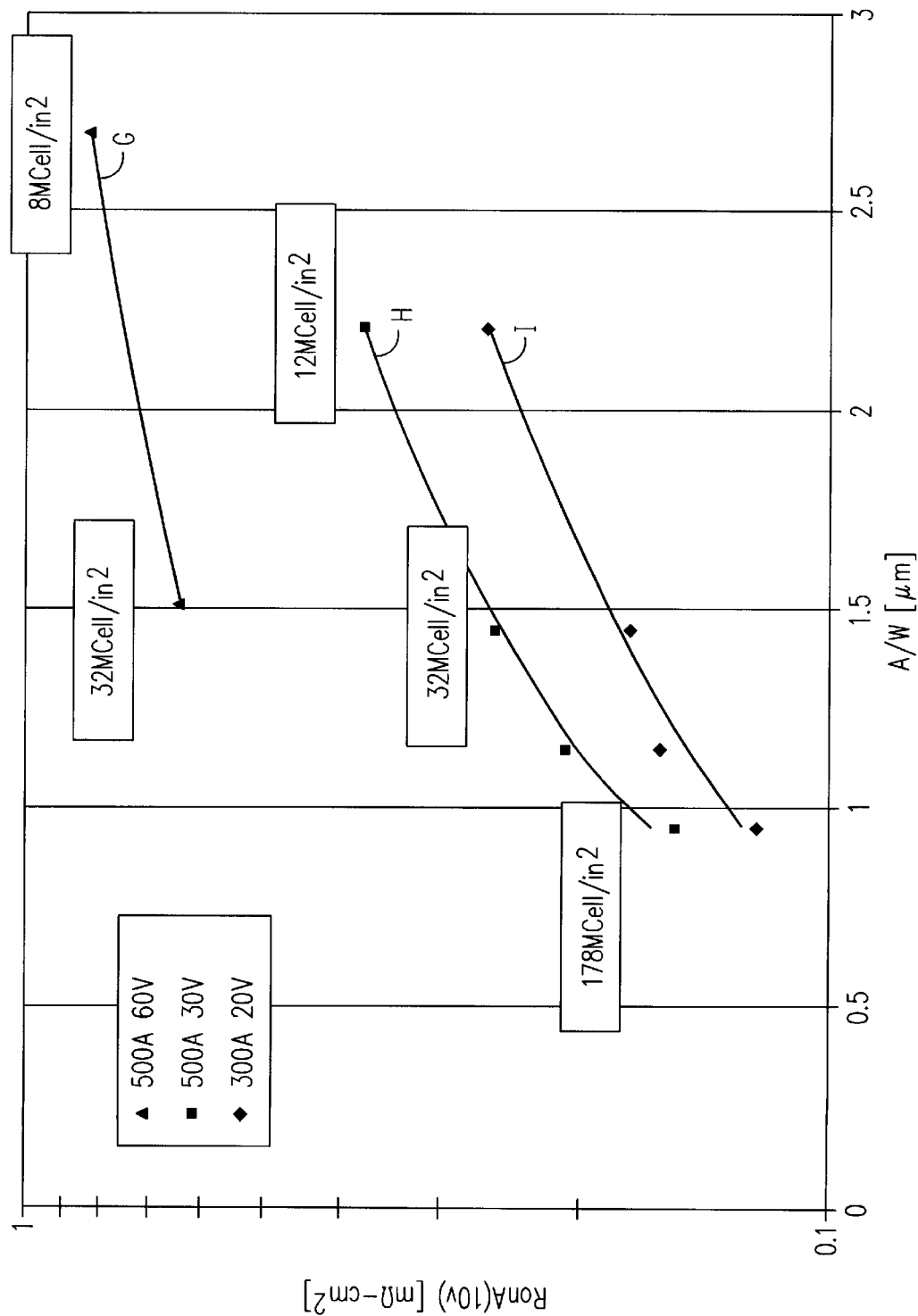
FIG. 13 is a graph showing the data of FIG. 12 plotted on semilog paper.

FIG. 12 shows the specific on-resistance RonA (mohm-cm$^2$) as a function of the area/perimeter ratio. Curve D is for a 500A 60V device with cell densities ranging from 8 Mcell/in to 32 Mcell/in$^2$. Curve E is for a 500 A 30V device with cell densities ranging from 12 Mcell/in to 178 Mcell/in$^2$. Curve F is for a 300 A 20V device with cell densities ranging from 12 Mcell/in$^2$ to 178 Mcell/in$^2$. In each case the gate voltage was 10V. The specific on-resistance is clearly significantly less in the 178 Mcell/in$^2$ device. FIG. 13 shows the same data plotted on semilog paper, with curves G, H and I corresponding to curves D, E and F, respectively.

Figure 14:
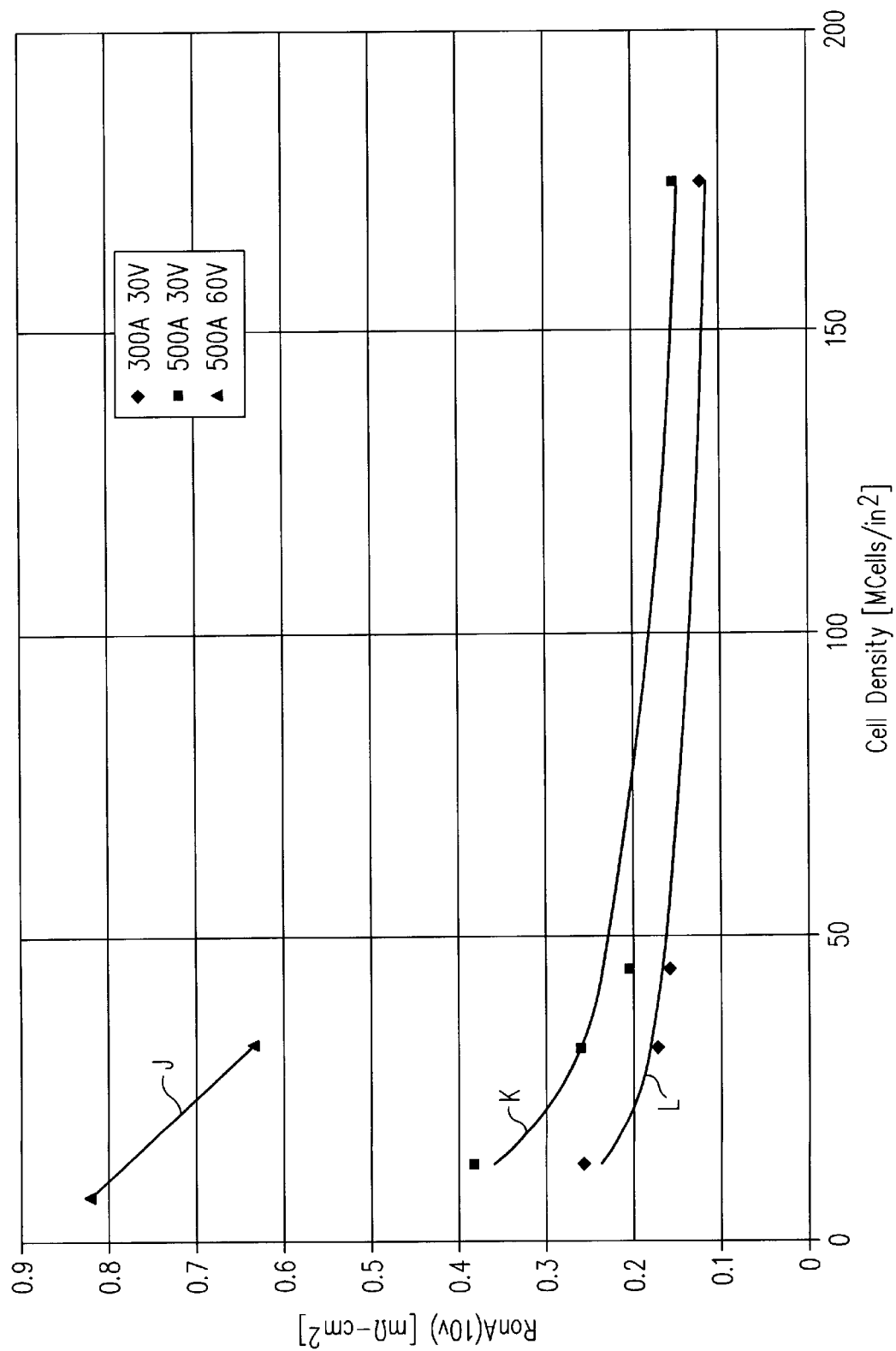
FIG. 14 is a graph showing specific on-resistance as a function of cell density for several different MOSFETs.

FIG. 14 shows RonA as a function of cell density. Curve J is for a 500 A 60V device, curve K is for a 500 A 30V device, and curve L is for a 300 A 30V device. Again the gate voltage was 10V.

Figure 15:
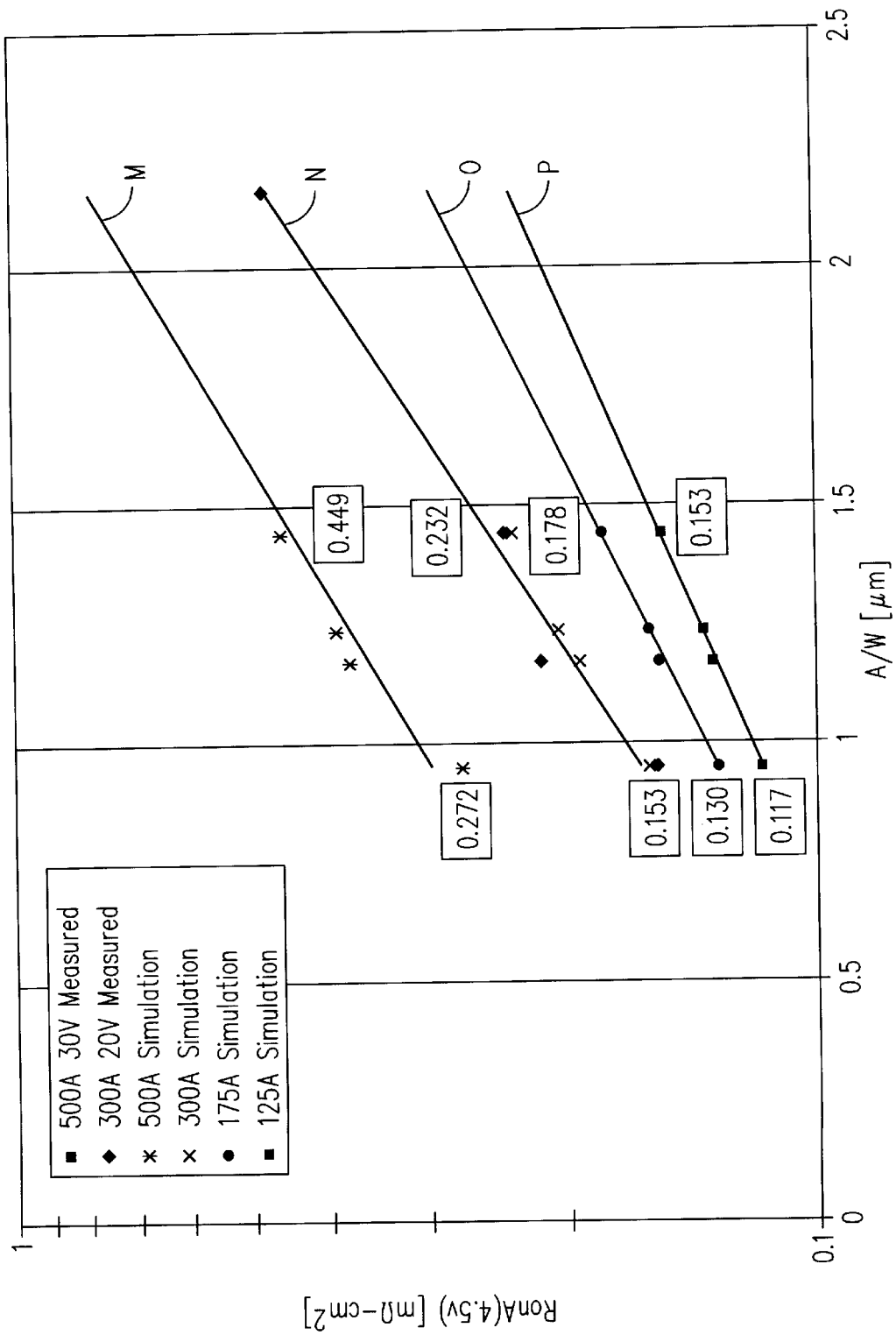
FIG. 15 is a graph showing specific on-resistance as a function of the area/perimeter ratio for several different MOSFETs.

FIG. 15 shows RonA as a function of the area/perimeter ratio for four simulations: curve M is for a 500 A device, curve N is for a 300 A device, curve o is for a 175 A device, and curve P is for a 125 A device. Also shown are measured data points for 500 A and 300 A devices which confirm the simulated data.

Figure 16:
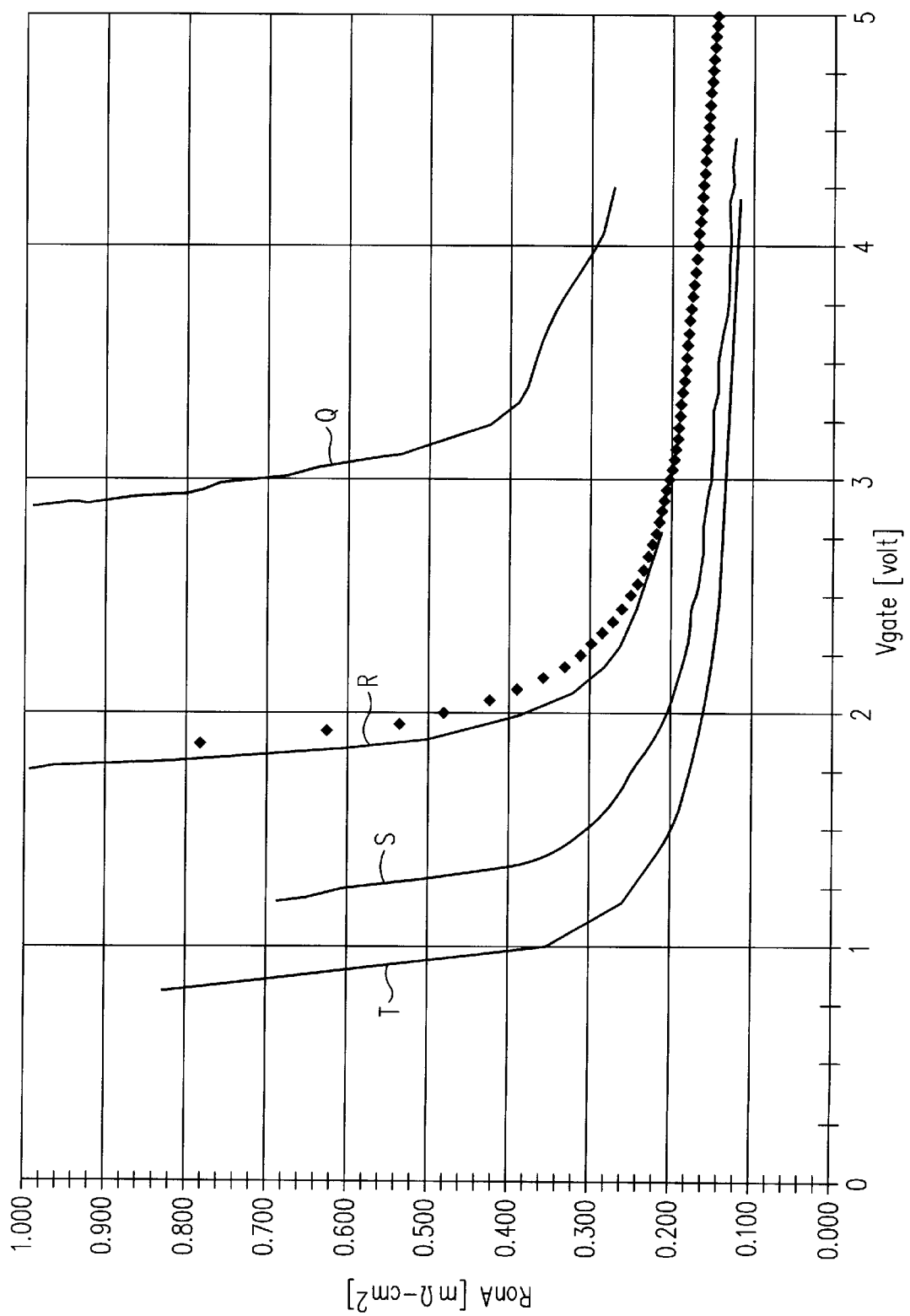
FIG. 16 is a graph showing the specific on-resistance as a function of gate voltage for several MOSFETs having a cell density of 178 Mcells/in$^2$.

FIG. 16 shows simulated RonA as a function of the gate voltage for four 178 Mcell/in devices: curve Q is for a 500 A device, curve R is for a 300 A device, curve S is for a 175 A device, and curve T is for a 125 A device. The diamonds show measured data points for the 300 A device.

While several specific embodiments of this invention have been shown, these embodiments are intended to be illustrative and not limiting. Many additional and alternative embodiments according to this invention will be apparent to persons skilled in the art.

What is claimed is:

1. A power MOSFET formed in a semiconductor chip, said MOSFET comprising:
   at least one MOSFET cell, said cell being formed in the shape of a longitudinal stripe having a length and a width, said stripe being located between opposing gate sections and having a top surface coincident with a surface of said chip, each of said gate sections being formed in a trench, said MOSFET cell comprising:
   a source region of a first conductivity type located adjacent a portion of said top surface;
   a body region of a second conductivity type located beneath said source region, said body region containing a channel region adjacent a wall of said trench;
   a drain region of said first conductivity type adjoining said body region; and
   a heavily-doped region within said body region, said heavily-doped region being of said second conductivity type and having a dopant concentration greater than a dopant concentration of a remainder of said body region, said heavily-doped region extending along said length of said cell and including at least one contact portion which extends to said surface of said cell.

2. The power MOSFET of claim 1 wherein said heavily-doped region has a dopant concentration of from $5 \times 10^{18}$ to $8 \times 10^{19}$ cm$^{-3}$.

3. The power MOSFET of claim 2 wherein said body region has a dopant concentration of from $8\times10^{15}$ to $7\times10^{17}$ cm$^{-3}$.

4. The power MOSFET of claim 1 wherein said cell has a length which is at least ten times a width of said cell.

5. The power MOSFET of claim 1 comprising a plurality of rows of said stripe cells, the number of said rows being less than ten.

6. The power MOSFET of claim 1 wherein said contact portion is located at an end of said cell.

7. The power MOSFET of claim 1 comprising a plurality of said contact portions located at intervals along a length of said cell.

8. The power MOSFET of claim 1 wherein said contact portion comprises a band extending along a length of said cell, said band being located approximately equidistant between said gate sections.

* * * * *

UNITED STATES PATENT AND TRADEMARK OFFICE
CERTIFICATE OF CORRECTION

PATENT NO.   : 6,204,533 B1
DATED         : March 20, 2001
INVENTOR(S)  : Richard K. Williams and Wayne B. Grabowski It is certified that error appears in the above-identified patent and that said Letters Patent is hereby corrected as shown below:

Column 2,
Line 55, please delete "conduction" and insert -- conjunction --; and

Column 7,
Line 47, please delete "YA" and insert -- Yg --.

Signed and Sealed this

Fifteenth Day of October, 2002

Attest:

JAMES E. ROGAN
Attesting Officer              Director of the United States Patent and Trademark Office